(12) United States Patent
Lee

(10) Patent No.: US 12,381,099 B2
(45) Date of Patent: Aug. 5, 2025

(54) DIE EJECTING APPARATUS FOR BONDING EQUIPMENT

(71) Applicant: SEMES CO., LTD., Cheonan-si (KR)

(72) Inventor: Hee Cheol Lee, Pyeongtaek-si (KR)

(73) Assignee: SEMES CO., LTD., Cheonan-si (KR)

( * ) Notice: Subject to any disclaimer, the term of this patent is extended or adjusted under 35 U.S.C. 154(b) by 371 days.

(21) Appl. No.: 17/870,109

(22) Filed: Jul. 21, 2022

(65) Prior Publication Data
US 2023/0022883 A1    Jan. 26, 2023

(30) Foreign Application Priority Data
Jul. 22, 2021   (KR) .......................... 10-2021-0096691

(51) Int. Cl.
*H01L 21/67*   (2006.01)
*H01L 21/68*   (2006.01)

(52) U.S. Cl.
CPC .. *H01L 21/67132* (2013.01); *H01L 21/67144* (2013.01); *H01L 21/68* (2013.01)

(58) Field of Classification Search
CPC ......... H01L 21/67132; H01L 21/67144; H01L 21/68; H01L 21/681
See application file for complete search history.

(56) References Cited

U.S. PATENT DOCUMENTS

| | | | |
|---|---|---|---|
| 7,759,164 B2* | 7/2010 | Maki | H01L 21/67132 156/707 |
| 8,470,130 B2* | 6/2013 | Chong | H01L 21/67132 156/707 |
| 2009/0170290 A1* | 7/2009 | Maki | H01L 21/67132 438/464 |
| 2023/0022883 A1* | 1/2023 | Lee | H01L 21/681 |

FOREIGN PATENT DOCUMENTS

| | | |
|---|---|---|
| TW | 200715426 | 4/2007 |
| TW | 202121493 | 6/2021 |

OTHER PUBLICATIONS

Office Action from the Taiwan Intellectual Property Office dated Aug. 18, 2023.

* cited by examiner

*Primary Examiner* — Minh N Trinh

(57) ABSTRACT

A die ejecting apparatus includes an ejector body having a cylindrical shape, ejector pins provided inside the ejector body and configured to rise or fall, a hood coupled to an upper portion of the ejector body and made of a light-transmitting material in which through holes through which the ejector pins may pass are formed, and a reinforcement member disposed in a form of a mesh mounted on the hood and overlapping the through holes.

6 Claims, 14 Drawing Sheets

DIE EJECTING APPARATUS FOR BONDING EQUIPMENT

CROSS REFERENCE TO RELATED APPLICATION

The present application claims priority to Korean Patent Application No. 10-2021-0096691, filed Jul. 22, 2021, the entire contents of which is incorporated by reference herein for all purposes.

BACKGROUND OF THE INVENTION

Field of the Invention

The present disclosure relates to a die ejecting apparatus and die bonding equipment including the same and, more particularly, to a die ejecting apparatus that uses an ejecting pin to separate a die and die bonding equipment including the same.

Description of the Related Art

A semiconductor manufacturing process is a process to fabricate semiconductor devices on a wafer, and includes, for example, exposure, delocation, etching, ion implantation, and cleaning. A process for bonding each die to a substrate (e.g., a printed circuit board (PCB)) for packaging may be performed with respect to a die configured in a chip unit through a semiconductor manufacturing process.

Each die is pushed up by an ejecting pin while attached to dicing tape and transferred by a die transfer unit located above. Meanwhile, in the process of separating the dies individually, it is necessary to accurately recognize the location of each die, and thus, placing additional light sources as an auxiliary means for recognizing the location of the die using a vision unit such as a camera is being discussed.

SUMMARY OF THE INVENTION

Accordingly, the present disclosure has been made keeping in mind the above problems occurring in the related art, and the present disclosure is intended to provide a die ejecting apparatus that uses a light-transmitting material and can prevent damage caused by pressure, and die bonding equipment including the same.

The objectives of the present disclosure are not limited to those mentioned above, and other objectives not mentioned will be clearly understood by those skilled in the art from the following description.

In order to achieve the above objective, according to an embodiment of the present disclosure, there is provided a die ejecting apparatus, including: an ejector body having a cylindrical shape; ejector pins provided inside the ejector body and configured to rise or fall; a hood coupled to an upper portion of the ejector body and made of a light-transmitting material in which through holes through which the ejector pins pass are formed; and a reinforcement member disposed in a form of a mesh mounted on the hood and overlapping the through holes.

According to the embodiment of the present disclosure, the die ejecting apparatus may further include: a light emitting unit positioned in an inner space of the ejector body to emit light toward the hood.

According to the embodiment of the present disclosure, a contour of a die may be detected by the light emitted by the light emitting unit.

According to the embodiment of the present disclosure, the reinforcement member may be made of a steel material.

According to the embodiment of the present disclosure, the reinforcement member may be inserted into a recessed portion drawn into the inside of the ejector body in the hood.

According to the embodiment of the present disclosure, a fiducial mark indicating a reference position for vision inspection may be formed around the recessed portion of the hood.

A die ejecting apparatus according to another embodiment of the present disclosure may include: an ejector body having a cylindrical shape; ejector pins provided inside the ejector body and configured to rise or fall; a hood coupled to an upper portion of the ejector body and made of a light-transmitting material in which through holes through which the ejector pins pass are formed; a reinforcement member disposed in a form of a mesh mounted on the hood and overlapping the through holes; a vision unit positioned above the hood to detect a location of a die; and a die transfer unit that picks up the die by moving to the location of the die provided from the vision unit.

Die bonding equipment according to an embodiment of the present disclosure includes: a wafer stage supporting a wafer containing individualized dies; a die ejecting unit that selectively separates the die from the wafer stage; a die transfer unit that transfers the die from the wafer; a die stage on which the die transferred by the die transfer unit is seated and inspection of the die is performed; a bonding unit that picks up the die from the die stage and bonds the die on a substrate; and a bonding stage that supports the substrate and transfers the bonded substrate to a magazine. The die ejecting unit may include: an ejector body having a cylindrical shape; ejector pins provided inside the ejector body and configured to rise or fall; a hood coupled to an upper portion of the ejector body and made of a light-transmitting material in which through holes through which the ejector pins pass are formed; a reinforcement member disposed in a form of a mesh mounted on the hood and overlapping the through holes; and a light emitting unit positioned in an inner space of the ejector body to emit light toward the hood.

According to the present disclosure, by using a reinforcement member in the form of a mesh on top of the hood made of a light-transmitting material, the rigidity of the hood can be strengthened and damage to the hood can be prevented.

The effects of the present disclosure are not limited to those mentioned above, and other effects not mentioned will be clearly understood by those skilled in the art from the following description.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
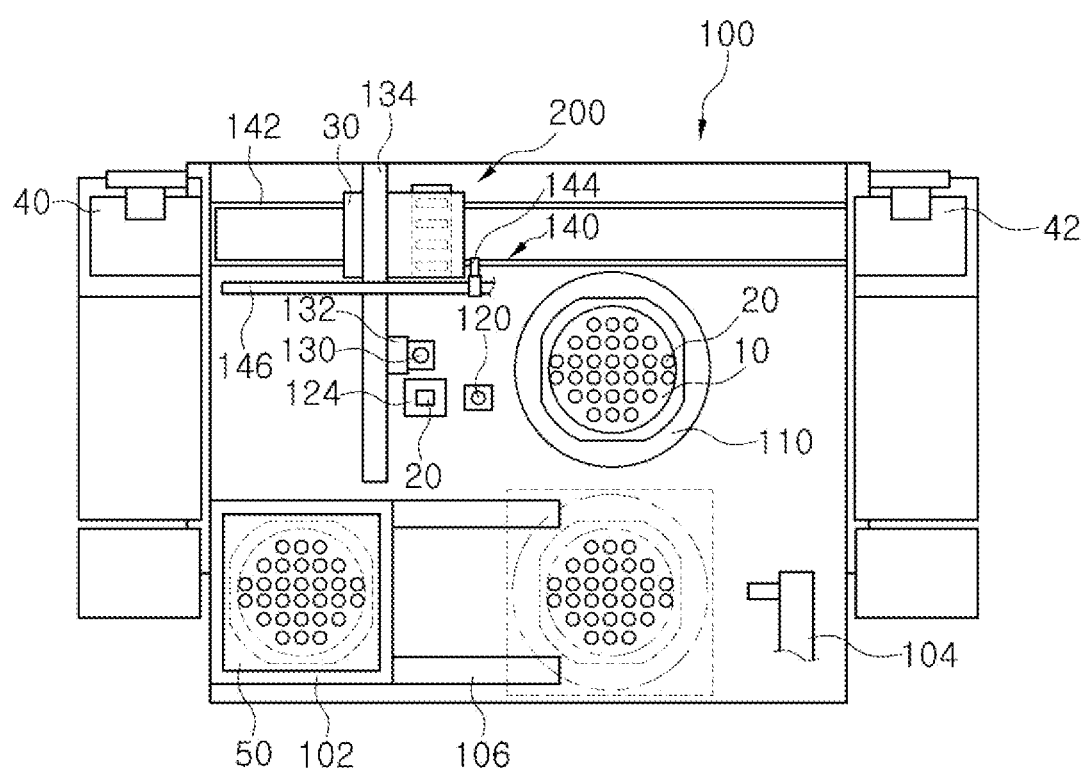
FIG. 1 shows a schematic structure of die bonding equipment to which the present disclosure may be applied.

Hereinafter, with reference to the accompanying drawings, embodiments of the present disclosure will be described in detail so that those of ordinary skill in the art can easily carry out the present disclosure. The present disclosure may be embodied in many different forms and is not limited to the embodiments described herein.

In order to clearly explain the present disclosure, parts irrelevant to the description are omitted, and the same reference numerals are given to the same or similar elements throughout the specification.

In addition, in various embodiments, components having the same configuration will be described only in the representative embodiment using the same reference numerals, and only configurations different from the representative embodiment will be described in other embodiments.

Throughout the specification, when a part is said to be "connected (or coupled)" with another part, this includes not only the case of "directly connected (or coupled)" but also the case of "indirectly connected (or coupled)" with another member therebetween.

In addition, when a part "includes" a certain component, it means that other components may be further included, rather than excluding other components, unless otherwise stated.

Unless defined otherwise, all terms used herein, including technical or scientific terms, have the same meaning as commonly understood by those of ordinary skill in the art to which the present disclosure pertains. Terms such as those defined in a commonly used dictionary should be interpreted as having a meaning consistent with the meaning in the context of the related art, unless explicitly defined in this application, it should not be construed in an ideal or overly formal sense.

Figure 2:
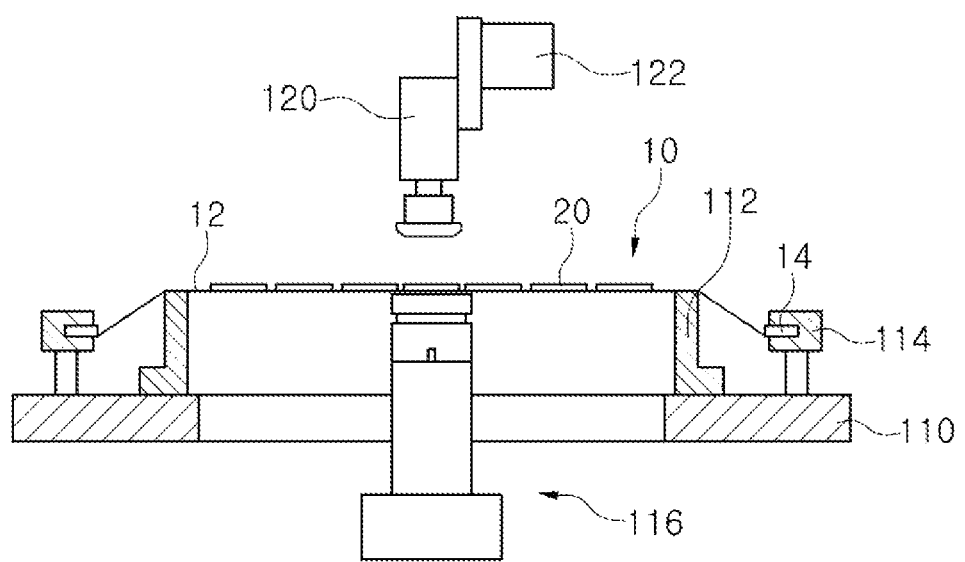
FIG. 2 shows a schematic structure of a die transfer unit in the die bonding equipment to which the present disclosure may be applied.

FIG. 1 shows a schematic structure of die bonding equipment 100 to which the present disclosure may be applied, and FIG. 2 shows a schematic structure of a die transfer unit in the die bonding equipment 100 to which the present disclosure may be applied. The die bonding equipment 100 may be used to bond a die 20 onto a substrate 30 (e.g., a printed circuit board (PCB), a lead frame) in a die bonding process for manufacturing a semiconductor package.

The bonding equipment 100 according to an embodiment of the present disclosure includes: a wafer stage 110 that supports a wafer including individualized dies 20 and selectively separates the dies 20; a die ejecting unit 116 that selectively separates the die 20 from the wafer stage 110; a die transfer unit 120 that transfers the die 20 from the wafer stage 110; a die stage 124 on which the die 20 transferred by the die transfer unit 120 is seated and inspection of the die 20 is performed; a bonding unit 130 that picks up the die 20 from the die stage 124 and bonds the die 20 on the substrate 30; and a bonding stage 200 that supports the substrate 30 and transfers the substrate 30 on which bonding is completed to a magazine 42.

The bonding equipment 100 may pick up the die 20 from the wafer 10 including the dies 20 individualized by a dicing process and bond the die 20 onto the substrate 30. The wafer 10 may be provided in a state attached to dicing tape 12, and the dicing tape 12 may be mounted on a mount frame 14 having a substantially circular ring shape. A cassette 50 in which a plurality of wafers 10 are accommodated is inserted in a load port 102. A wafer transfer unit 104 takes out the wafer 10 from the cassette 50 and loads the wafer 10 on the wafer stage 110, and the wafer transfer unit 104 may move along a guide rail 106 installed between the cassette 50 and the wafer stage 110.

An expansion ring 112 in the form of a circular ring may be disposed on the wafer stage 110, and the expansion ring 112 may support an edge portion of the dicing tape. In addition, clamps 114 for holding the mount frame 14, and a clamp drive part (not shown) that expands the dicing tape 12 by lowering the clamps 114 while the dicing tape 12 is supported by the expansion ring 112 may be disposed on the wafer stage 110.

Although not shown, the wafer stage 110 may be configured to be movable in the horizontal direction by a stage drive part (not shown), and the stage drive part may move the wafer stage 110 to a wafer load/unload area (area indicated by a dotted line in FIG. 1) adjacent to an end of the guide rail 106 for loading and unloading the wafer 10. Also, the stage drive part may move the wafer stage 110 to selectively pick up the die 20. That is, the stage drive part may adjust the position of the wafer stage 110 so that the die 20 to be picked up among the dies 20 is located above the die ejecting unit 116.

The die 20 separated by the die ejecting unit 116 may be picked up by the die transfer unit 120 disposed above the wafer stage 110. The die transfer unit 120 may pick up the die 20 and then transfer the die 20 onto the die stage 124 disposed on one side of the wafer stage 110, and the bonding unit 130 may pick up the die 20 on the die stage 124 and bond the picked-up die 20 to the substrate 30. The die transfer unit 120 moves to the position of the die 20 measured by a vision unit 121, and the operation of the die transfer unit 120 may be controlled by a control unit 122.

The substrate 30 may be drawn out from the first magazine 40 and transferred onto the bonding stage 200, and after the bonding process is completed, the substrate 30 may be transferred to and accommodated in the second magazine 42. The bonding equipment 100 may include a substrate transfer unit 140 for transferring the substrate 30 onto the bonding stage 200. For example, the substrate transfer unit 140 may include: the first magazine 40; the bonding stage 200; a gripper 144 for gripping one end of the substrate 30; and a gripper drive unit 146 for moving the gripper 144 in the horizontal direction (X-axis direction). The gripper drive unit 146 may load the substrate 30 onto the bonding stage 200 by moving the gripper 144 after one end of the substrate 30 is gripped by the gripper 144. Although not shown, the substrate transfer unit 140 may further include a second gripper (not shown) for moving the substrate 30 to the second magazine 42 after the bonding process is completed.

The bonding equipment 100 may include: a first head drive unit 132 for picking up the die 20 on the die stage 124 and moving the bonding unit 130 in the vertical direction to bond the die onto the substrate 30; and a second head drive unit 134 for moving the bonding unit 130 in a second horizontal direction (e.g., Y-axis direction) perpendicular to the horizontal direction between the die stage 124 and the bonding stage 200. Although not shown in detail, the bonding unit 130 may include a bonding tool for picking up the die 20 using vacuum pressure, and a heater for heating the die 20. That is, the bonding unit 130 may pick up the die 20 on the die stage 124 and bond the die to the substrate 30. Also, the bonding unit 130 may pick up the die 20 from the wafer 10 and directly bond the die 20 onto the substrate 30.

Meanwhile, on the upper part of the bonding stage 200, a camera may be disposed to image a fiducial mark on the substrate 30 and an area to which the die 20 is to be bonded for adjusting position, that is, for aligning, of the substrate 30. In addition, although not shown, the bonding equipment 100 may include a plurality of cameras for detection of the die 20 on the wafer 10, detection of the die 20 on the die stage 124, and the detection of the die 20 picked up by the bonding unit 130, etc.

Figure 3:
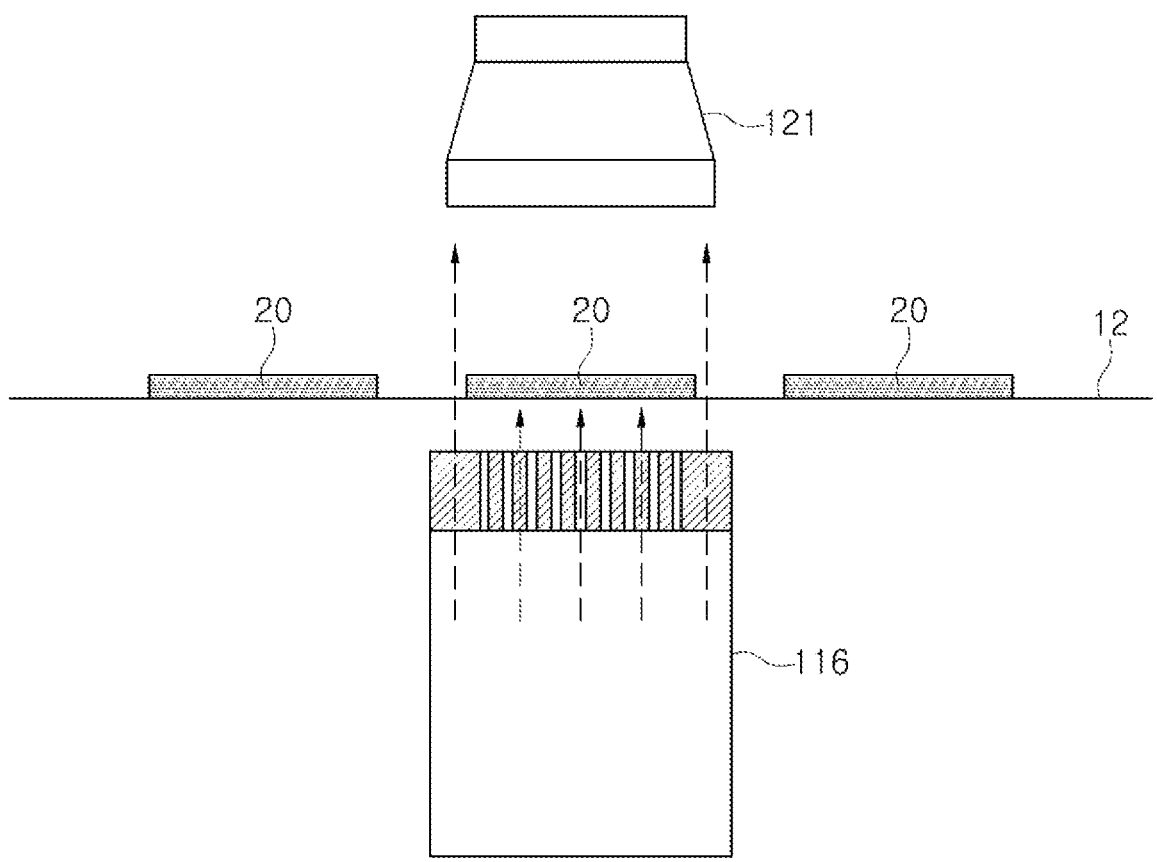
FIGS. 3 and 4 show a process of detecting the location of a die by using an ejecting unit having a light source therein.
Figure 4:
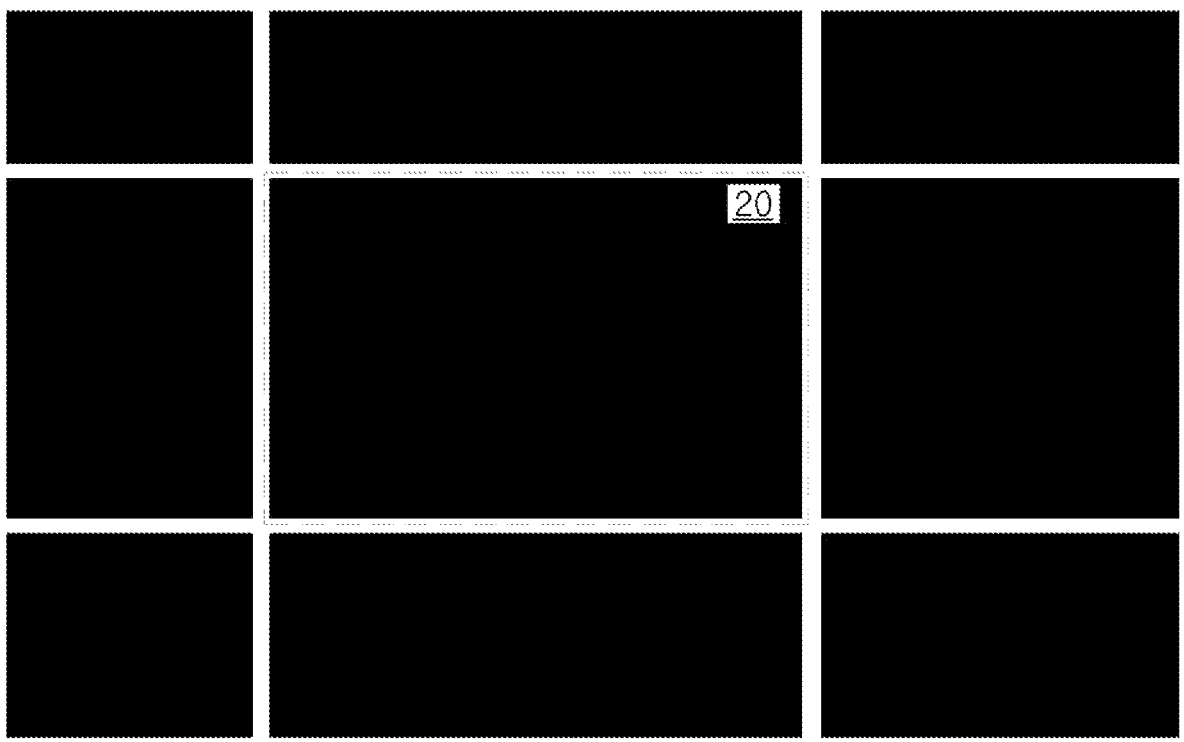

FIGS. 3 and 4 show a process of detecting the location of a die by using an ejecting unit having a light source therein. Referring to FIG. 3, a plurality of dies 20 are disposed on the dicing tape 12, and a die ejecting unit 116 is positioned under the die 20. Light is emitted toward the die 20 by a light source disposed inside the die ejecting unit 116, and the light is blocked in the region where the die 20 is located and the light passes through the empty space between the dies 20. Thus, the vision unit 121 located on the upper part acquires an image as shown in FIG. 4, and may identify the region in which the die 20 is located through the light shining on the outside of the die 20.

Figure 5:
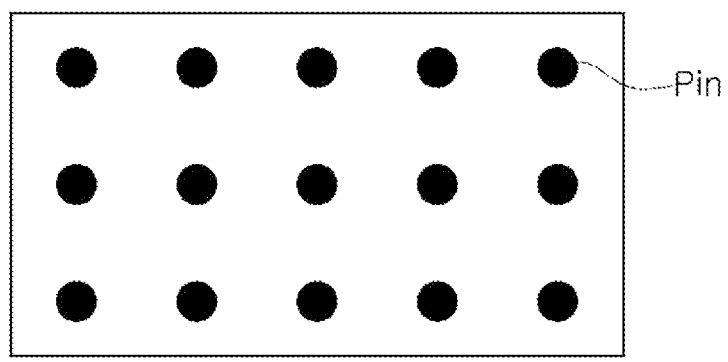
FIG. 5 shows an example of an ejecting pin arrangement structure provided in the ejecting unit.

The die transfer unit 120 picks up the die 20 after moving according to the location of the die 20 detected by the vision unit 121. Meanwhile, the die 20 is attached to the dicing tape 12, and in particular, the very thin die 20 is not easy to separate from the dicing tape 12. Thus, the ejecting unit 116 has an ejecting pin, which rises to push up the die 20 to separate the die 20 from the dicing tape 12. Ejecting pins may be disposed at regular intervals as shown in FIG. 5, and all or some of the pins may rise according to the user's intention.

Meanwhile, when a light-transmitting material (e.g., polycarbonate, methyl methacrylate, and polymethylmethacrylate) is applied to the ejecting unit 116 as shown in FIG. 3, there are several problems. For example, scratches by the ejecting pin may occur when the ejecting pin is raised or lowered, and scratches or rips may occur due to pressurization when the die transfer unit 120 is raised or lowered. Accordingly, the present disclosure provides a method for preventing scratches or rips from occurring when a light-transmitting material is used.

Figure 6:
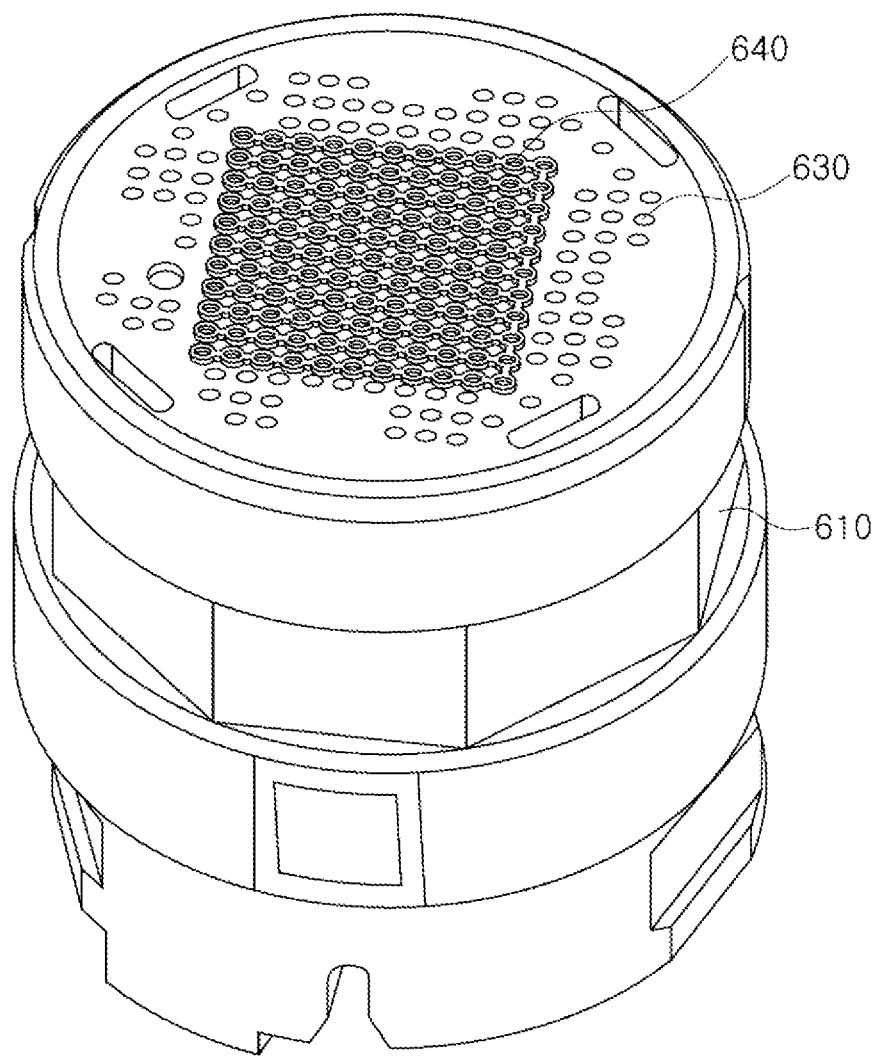
FIGS. 6 to 8 show an example of a die ejecting apparatus according to an embodiment of the present disclosure.
Figure 7:
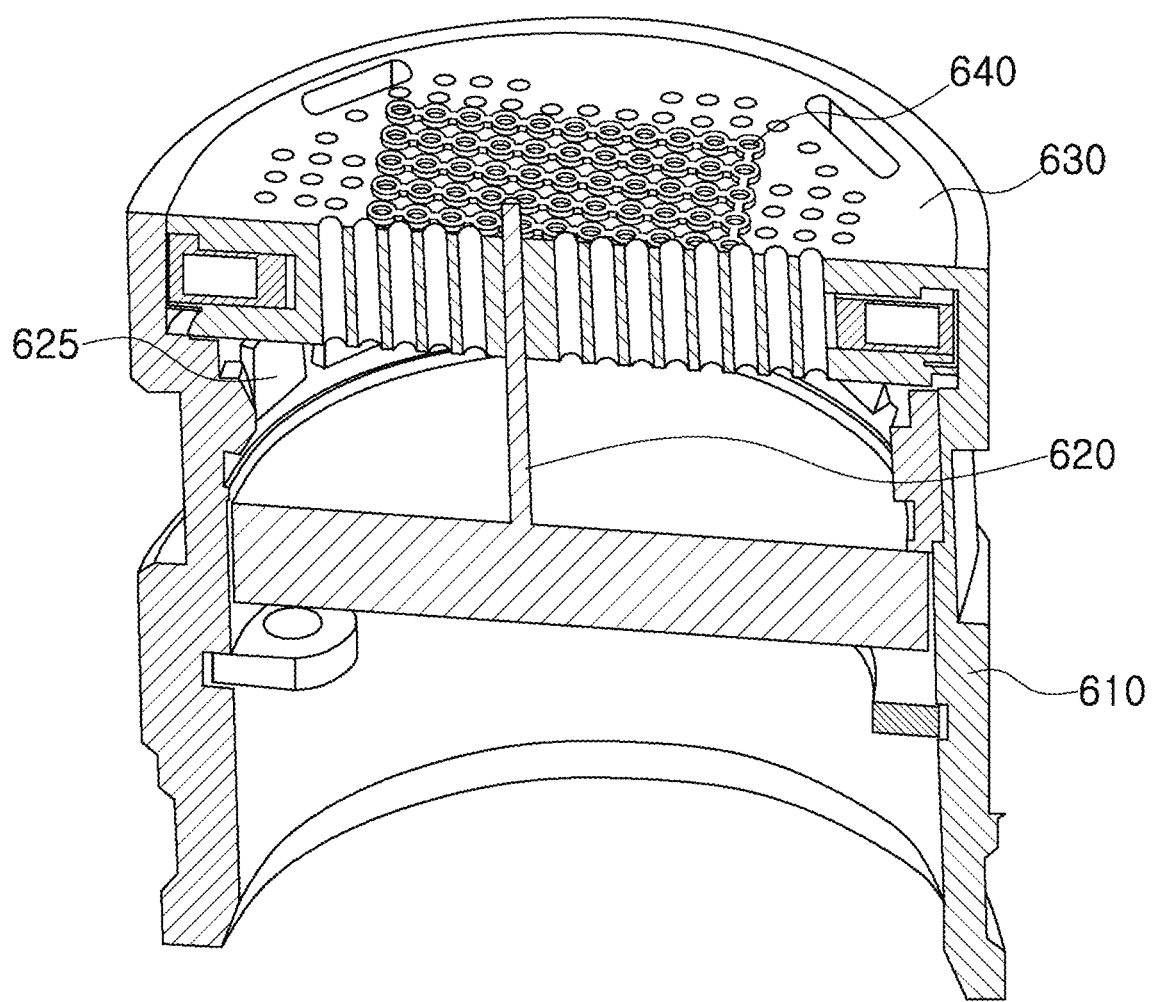
Figure 8:
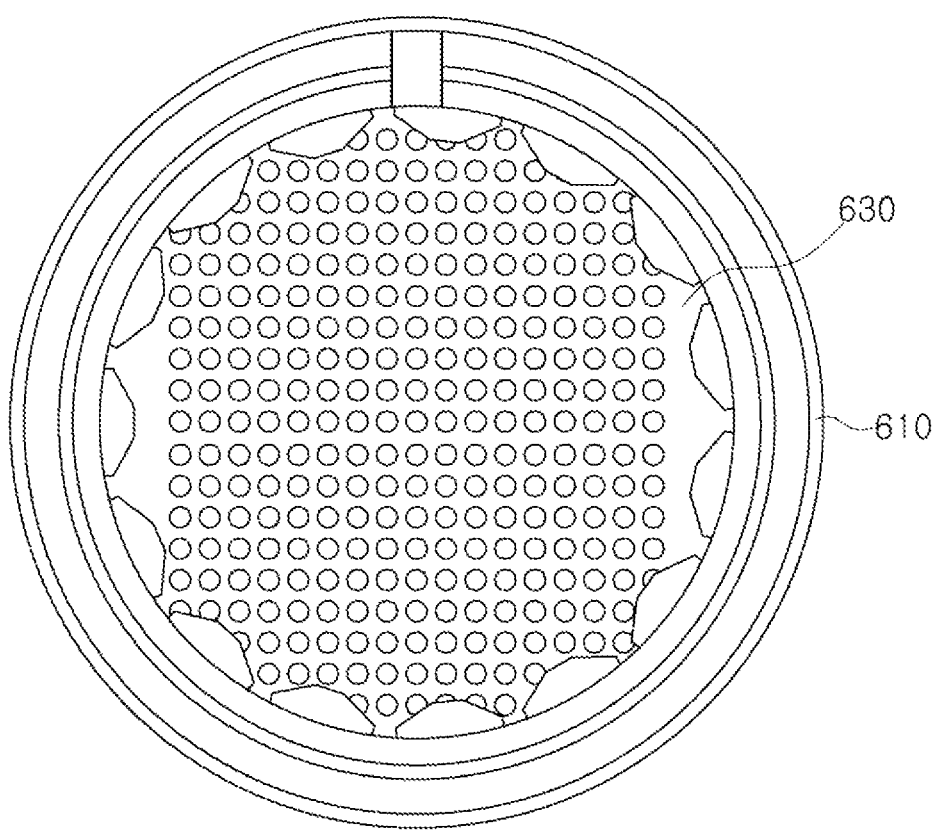

FIGS. 6 to 8 show an example of a die ejecting apparatus according to an embodiment of the present disclosure. FIG. 6 is a perspective view showing an appearance of the die ejecting apparatus, and FIGS. 7 and 8 show side cross-sections of the die ejecting apparatus.

A die ejecting apparatus according to an embodiment of the present disclosure includes: an ejector body 610 having a cylindrical shape; an ejector pin 620 provided inside the ejector body 610 and configured to rise or fall; a hood 630 coupled to the upper portion of the ejector body 610 and made of a light-transmitting material in which through holes 632 through which the ejector pin 620 may pass are formed; and a reinforcement member 640 disposed in the form of a mesh mounted on the hood 630 and configured to correspond to (i.e., overlapping) the through holes 632.

According to the present disclosure, by applying a mesh-shaped reinforcement member 640 mounted on top of the hood 630 made of a light-transmitting material, it is possible to improve the rigidity of the hood 630 and prevent scratching by the ejector pin 620.

The ejector pin 620 may be composed of one or more pins, and the ejector pin 620 may be raised or lowered by a lifting drive unit after being mounted on the lower pin holder.

According to the embodiment of the present disclosure, the die ejecting apparatus may further include: a light emitting unit 625 positioned in the inner space of the ejector body 610 to emit light toward the hood 630. The light emitting unit 625 may include a light emitting device such as a light emitting diode (LED), and may be located on an inner sidewall of the ejector body 610. According to the present disclosure, the outline of the die 20 may be detected by the light emitted by the light emitting unit 625.

Figure 9:
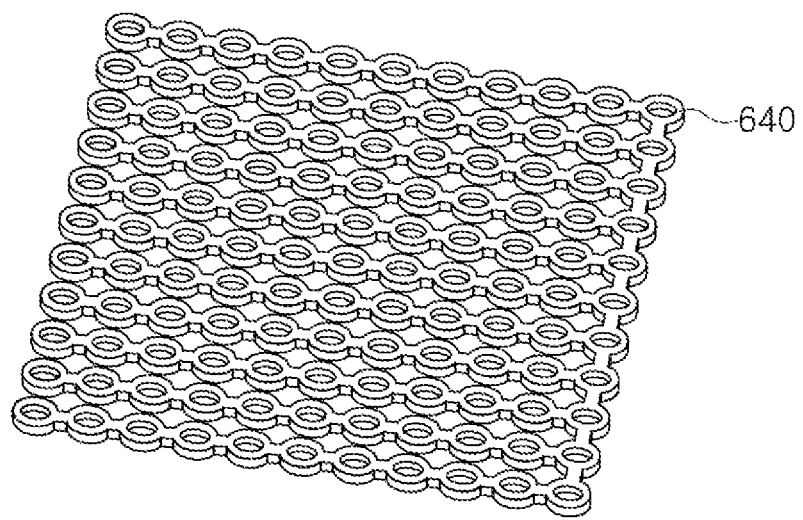
FIG. 9 shows a reinforcement member in the die ejecting apparatus according to the embodiment of the present disclosure.

FIG. 9 shows a reinforcement member in the die ejecting apparatus according to the embodiment of the present disclosure. The reinforcement member 640 is detachable from the hood 630 but may be provided in a mesh form so that the ejector pins 620 may pass therethrough. The reinforcement member 640 may be made of a steel material.

Figure 10:
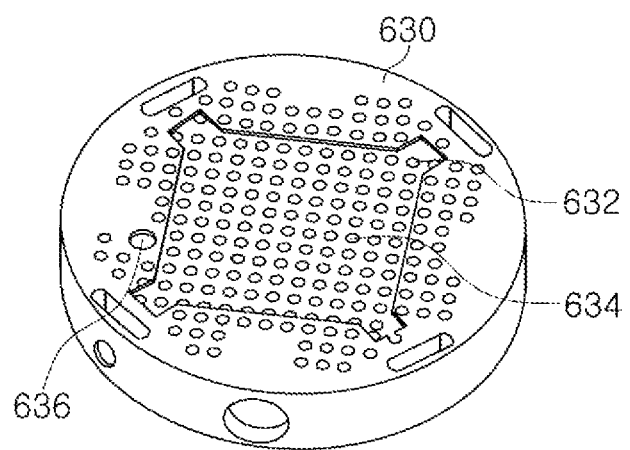
FIG. 10 shows a hood in the die ejecting apparatus according to the embodiment of the present disclosure.

FIG. 10 shows a hood in the die ejecting apparatus according to the embodiment of the present disclosure.

The hood 630 is a film made of a transparent material composed of through holes through which the ejector pins 620 may pass, and may be made of a material such as polycarbonate, methyl methacrylate, or polymethylmethacrylate. The through holes 632 through which the ejector pins 620 may pass are formed in the hood 630. In addition, the hood 630 has a recessed portion 634 drawn into the ejector body 610 is formed, and a fiducial mark indicating a reference position for vision inspection around the recessed portion 634 may be formed.

Figure 11:
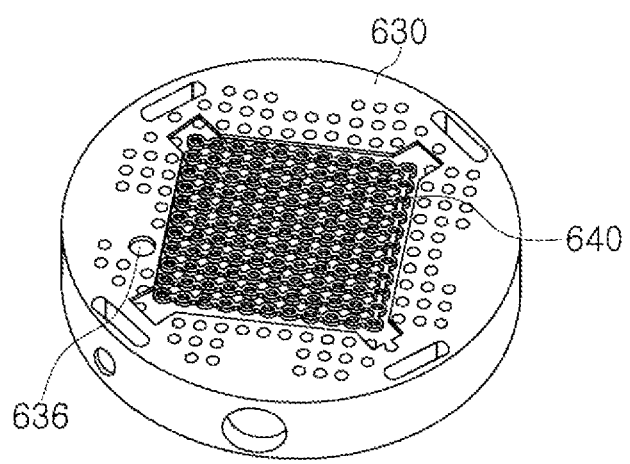
FIGS. 11 and 12 show the hood to which the reinforcement member is attached according to the embodiment of the present disclosure.
Figure 12:
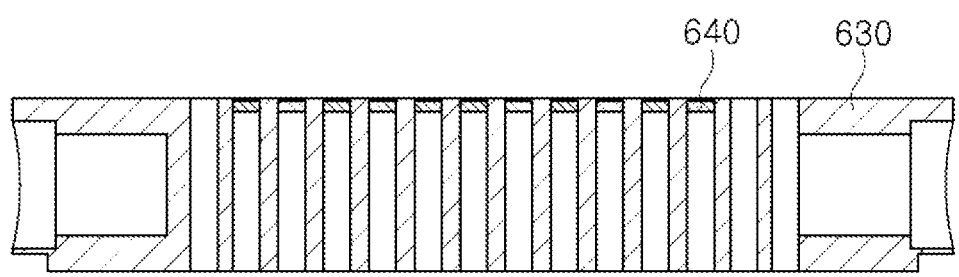

FIGS. 11 and 12 show the hood to which the reinforcement member is attached according to the embodiment of the present disclosure. FIG. 11 is a perspective view illustrating the outside of the hood 630 to which the reinforcement member 640 is attached, and FIG. 12 is a side cross-sectional view of the hood 630 to which the reinforcement member 640 is attached.

The reinforcement member 640 may be inserted into the recessed portion 634 drawn into the inside of the ejector body 610 in the hood 630. The height at which the recessed portion 634 is recessed may be set to be equal to the thickness of the reinforcement member 640. The reinforcement member 640 may be adhered to the recessed portion 634 of the hood 630 by an adhesive material.

Figure 13A:
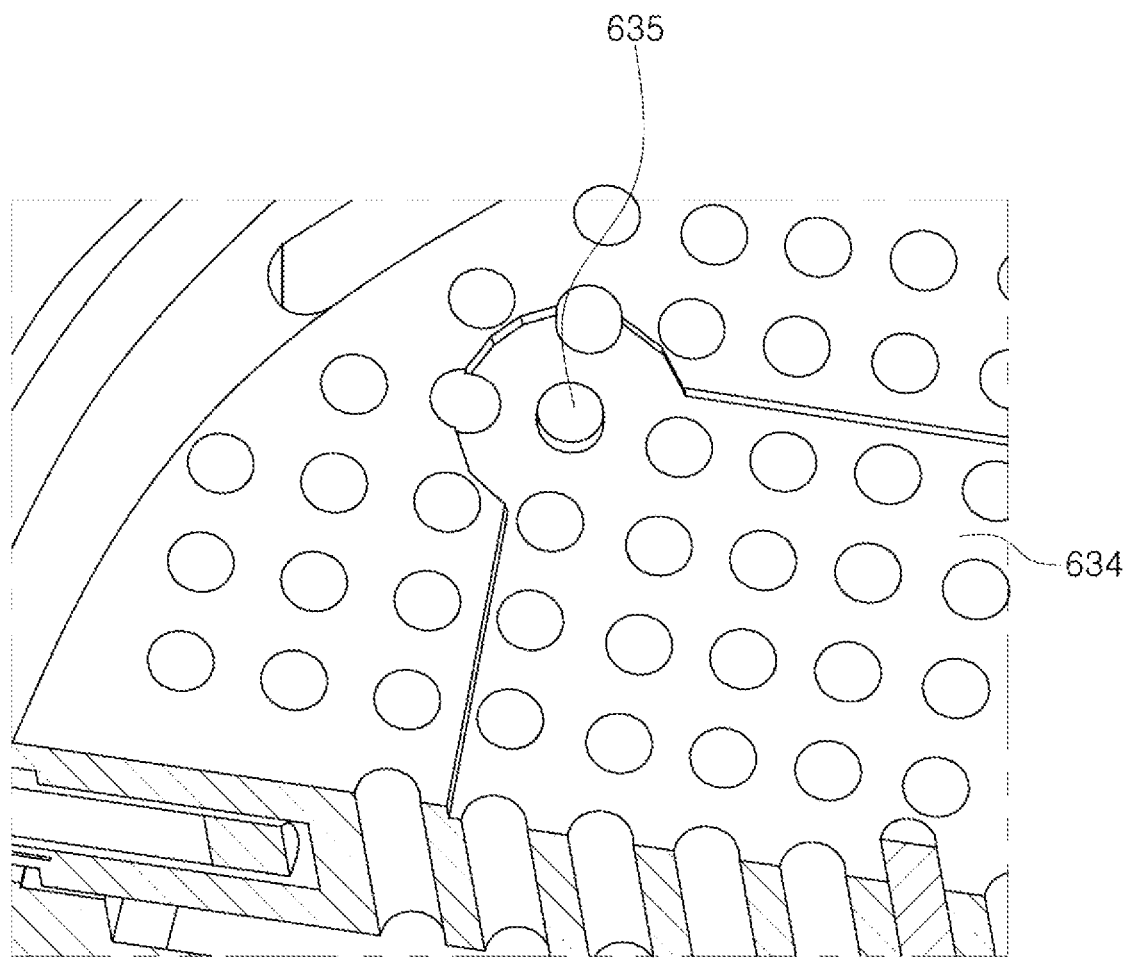
FIGS. 13A and 13B show a structure for attaching and detaching the reinforcement member in the hood according to the embodiment of the present disclosure.
Figure 13B:
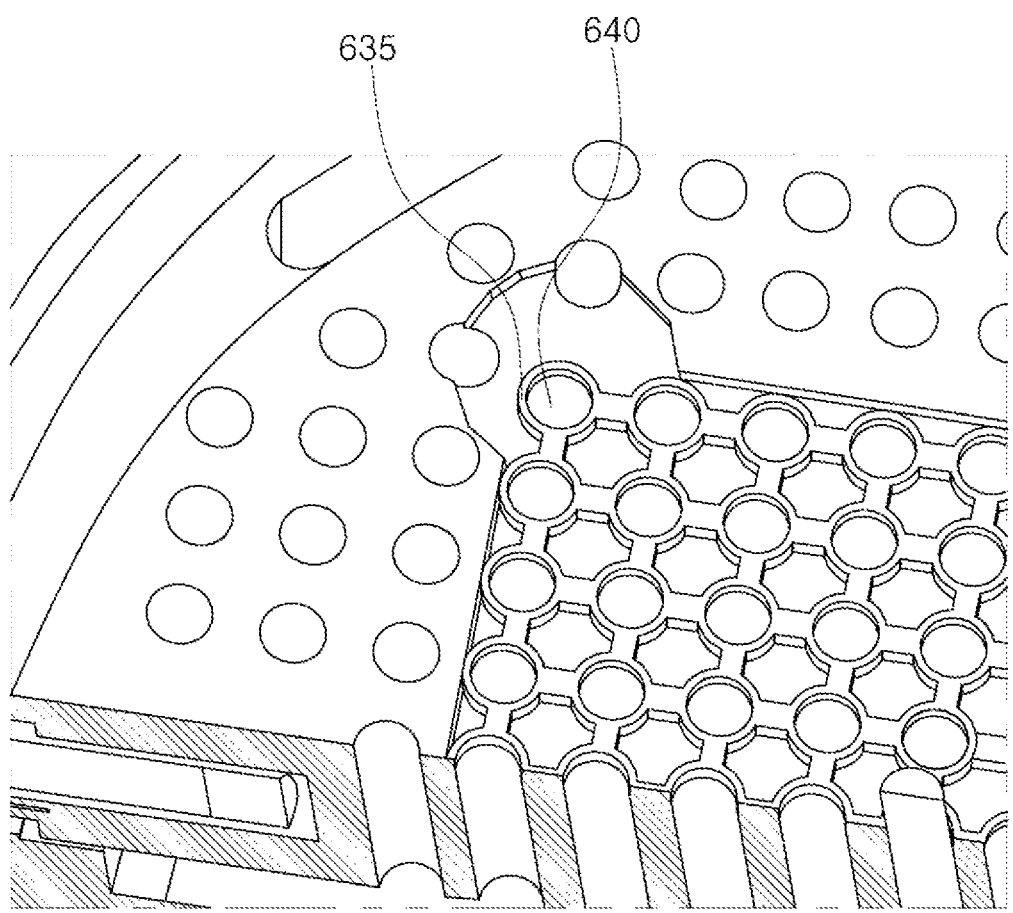

FIGS. 13A and 13B show a structure for attaching and detaching the reinforcement member in a hood according to an embodiment of the present disclosure. As shown in FIG. 13A, a protrusion 635 into which the reinforcement member 640 may be inserted may be formed at each corner of the recessed portion 634 of the hood 630. As shown in FIG. 13B, the corner hole of the reinforcement member 640 may be inserted into the protrusion 635 located at the edge of the recessed portion 634 of the hood 630. As shown in FIGS. 13A and 13B, by allowing the reinforcement member 640 to be inserted into the protrusion 635 of the hood 630, the reinforcement member 640 may be easily attached or detached.

Meanwhile, the die ejecting apparatus may include: the vision unit 121 positioned above the hood 630 to detect the location of the die 20; and the die transfer unit 120 for picking up the die 20 by moving to the location of the die 20 provided from the vision unit 121.

The die ejecting apparatus described above may be implemented as part of the die ejecting unit 116 in the die bonding equipment 100. The die ejecting apparatus according to the present disclosure includes: a wafer stage 110 that supports a wafer 10 including individualized dies 20; a die ejecting unit 116 that selectively separates the die 20 from the wafer stage 110; a die transfer unit 120 that transfers the die 20 from the wafer stage 110; a die stage 124 on which the die 20 transferred by the die transfer unit 120 is seated and inspection of the die 20 is performed; a bonding unit 130 that picks up the die 20 from the die stage 124 and bonds the die 20 on the substrate 30; and a bonding stage 200 that supports the substrate 30 and transfers the substrate 30 on which bonding is completed to a magazine 42. The die ejecting unit 116 includes: an ejector body 610 having a cylindrical shape; ejector pins 620 provided inside the ejector body 610 and configured to rise or fall; a hood 630 coupled to the upper portion of the ejector body 610 and made of a light-transmitting material in which through holes 632 through which the ejector pins 620 may pass are foamed; a reinforcement member 640 in the form of a mesh mounted on the hood 630 and configured to correspond to the through holes 632; and a light emitting unit 625 positioned in the inner space of the ejector body 610 to emit light toward the hood 630.

The embodiments and the accompanying drawings in this specification only clearly show a part of the technical idea included in the present disclosure, and thus it will be apparent that all modifications and specific embodiments that can be easily inferred by those skilled in the art within the scope of the technical idea included in the specification and drawings of the present disclosure are included in the scope of the present disclosure.

Therefore, the spirit of the present disclosure should not be limited to the described embodiments, and not only the claims to be described later, but also all equivalents or equivalent modifications to the claims should be construed as being included in the scope of the spirit of the present disclosure.

What is claimed is:

1. A die ejecting apparatus, comprising:
    an ejector body having a cylindrical shape;
    ejector pins provided inside the ejector body, wherein the ejector pins are move up and down within the ejector body;
    a hood coupled to an upper portion of the ejector body and made of a light-transmitting material, wherein the hood includes through holes through which the ejector pins pass;
    a reinforcement member disposed in a form of a mesh mounted on the hood and overlapping the through holes; and
    a light emitting unit positioned in an inner space of the ejector body to emit light toward the hood.

2. The die ejecting apparatus of claim 1, further comprising:
    a vision unit positioned above the hood,
    wherein the vision unit detects a location of a die.

3. The die ejecting apparatus of claim 1, wherein the reinforcement member is made of a steel material.

4. The die ejecting apparatus of claim 1, wherein the reinforcement member is inserted into a recessed portion drawn into an inside of the ejector body in the hood.

5. The die ejecting apparatus of claim 4, wherein the reinforcement member is adhered to the recessed portion of the hood by an adhesive material.

6. The die ejecting apparatus of claim 4, wherein a fiducial mark indicating a reference position for vision inspection is formed around the recessed portion of the hood.

* * * * *